(12) United States Patent
Gerster et al.

(10) Patent No.: US 10,804,420 B2
(45) Date of Patent: Oct. 13, 2020

(54) SOLAR CELL ARRAYS FOR CONCENTRATOR PHOTOVOLTAIC MODULES

(75) Inventors: Eckart Gerster, Freiburg (DE); Martin Ziegler, Freiburg (DE)

(73) Assignee: Saint-Augustin Canada Electric Inc., Saint-Augustin de Desmaures, CA (US)

( * ) Notice: Subject to any disclaimer, the term of this patent is extended or adjusted under 35 U.S.C. 154(b) by 0 days.

(21) Appl. No.: 14/000,260

(22) PCT Filed: Feb. 23, 2012

(86) PCT No.: PCT/EP2012/000788
§ 371 (c)(1),
(2), (4) Date: Oct. 8, 2013

(87) PCT Pub. No.: WO2012/113561
PCT Pub. Date: Aug. 30, 2012

(65) Prior Publication Data
US 2014/0020732 A1    Jan. 23, 2014

(30) Foreign Application Priority Data

Feb. 24, 2011   (EP) .................................... 11001542

(51) Int. Cl.
*H01L 31/044*   (2014.01)
*H01L 31/05*    (2014.01)
(Continued)

(52) U.S. Cl.
CPC .... *H01L 31/0512* (2013.01); *H01L 31/02008* (2013.01); *H01L 31/042* (2013.01);
(Continued)

(58) Field of Classification Search
CPC ............... H01L 31/044; H01L 31/0504; H01L 31/02008; H01L 31/042; H01L 31/0512; H01R 13/6641; H02S 40/34
(Continued)

(56) References Cited

U.S. PATENT DOCUMENTS 3,973,996 A * 8/1976 Kennedy ...................... 136/206
4,400,409 A * 8/1983 Izu et al. ........................ 438/62
(Continued)

FOREIGN PATENT DOCUMENTS

| CN | 2318710 Y | 5/1999 |
| CN | 101057342 | 10/2007 |

(Continued)

OTHER PUBLICATIONS

International Search Report for International Application No. PCT/EP2012/000788 dated Apr. 12, 2013, 5 pages.
(Continued)

*Primary Examiner* — Niki Bakhtiari
(74) *Attorney, Agent, or Firm* — TraskBritt

(57) ABSTRACT

The present invention relates to a solar cell array configuration comprising a plurality of solar cells provided on at least one substrate, a plurality of contact pads, one contact pad for each of the plurality of solar cells, provided on the at least one substrate, electrical wiring connecting each of the plurality of solar cells with a corresponding one of the plurality of contact pads and a diode electrically connected with at least two of the plurality of solar cells.

18 Claims, 3 Drawing Sheets

(51) Int. Cl.
*H01L 31/054* (2014.01)
*H01L 31/02* (2006.01)
*H01L 31/042* (2014.01)

(52) U.S. Cl.
CPC ........ *H01L 31/044* (2014.12); *H01L 31/0504* (2013.01); *H01L 31/0547* (2014.12); *Y02E 10/52* (2013.01)

(58) Field of Classification Search
USPC .................................................. 136/243–265
See application file for complete search history.

(56) References Cited

U.S. PATENT DOCUMENTS

| | | | | |
|---|---|---|---|---|
| 4,481,378 | A | * | 11/1984 | Lesk ................. H01L 31/02021 136/244 |
| 4,754,544 | A | * | 7/1988 | Hanak ............................. 438/66 |
| 4,769,086 | A | * | 9/1988 | Tanner ............ H01L 31/022425 136/244 |
| 5,043,024 | A | * | 8/1991 | Cammerer et al. ........... 136/244 |
| 5,228,924 | A | * | 7/1993 | Barker et al. ................. 136/246 |
| 7,381,886 | B1 | * | 6/2008 | Aiken et al. .................. 136/246 |
| 2002/0046764 | A1 | * | 4/2002 | Ansley et al. ................ 136/245 |
| 2004/0025932 | A1 | * | 2/2004 | Husher ......................... 136/256 |
| 2006/0054210 | A1 | | 3/2006 | Proisy et al. |
| 2006/0249194 | A1 | | 11/2006 | Joslin et al. |
| 2008/0000523 | A1 | * | 1/2008 | Hilgarth .............. H01L 31/0475 136/255 |
| 2008/0156365 | A1 | * | 7/2008 | Scholz ............. H01L 31/02013 136/251 |
| 2009/0242015 | A1 | * | 10/2009 | Wattman ............... H01L 31/048 136/251 |
| 2010/0163098 | A1 | | 7/2010 | Clemens et al. |
| 2010/0326511 | A1 | * | 12/2010 | Wakayama et al. .......... 136/256 |
| 2012/0285530 | A1 | * | 11/2012 | Ziegler ................. H01L 31/052 136/256 |

FOREIGN PATENT DOCUMENTS

| | | |
|---|---|---|
| CN | 101355107 A | 1/2009 |
| CN | 101548394 A | 9/2009 |
| CN | 201387892 Y | 1/2010 |
| DE | 202006000368 U1 | 10/2006 |
| JP | 2000-277785 A | 10/2000 |
| JP | 2008-541429 A | 11/2008 |
| KR | 1020090086096 A | 8/2009 |
| WO | 2006027225 A1 | 3/2006 |
| WO | WO2006-027225 | * 3/2006 |
| WO | WOW-2011-104016 | * 9/2011 |

OTHER PUBLICATIONS

International Preliminary Report on Patentability for International Application No. PCT/EP2012/000788 dated Aug. 27, 2013, 6 pages.
International Written Opinion for International Application No. PCT/EP2012/000788 dated Apr. 12, 2012, 5 pages.
International Search Report for International Application No. PCT/EP2012/000788 dated Apr. 12, 2012, 5 pages.
European Search Report and Search Opinion for European Application No. EP11001542.7 dated Jul. 6, 2011, 6 pages.
Korean Office Action for Korean Application No. 10-2013-7022234 dated Sep. 20, 2017, 14 pages.
Korean Notice of Preliminary Rejection for Korean Application No. 10-2018-7019412 dated Oct. 21, 2018, 11 pages.
Korean Office Action for Korean Application No. 10-2013-7022234 dated Mar. 30, 2018.
Korean Office Action for Korean Application No. 10-2013-7022234 dated Jun. 7, 2018.
Korean Notice of Decision of Rejection for Korean Application No. 10-2018-701942 dated Apr. 26, 2019, 7 pages.
Korean Notice of Final Rejection for Korean Application No. 10-2018-7019412, dated Apr. 26, 2019, 6 pages with English Translation.
Korean Notice of Final Rejection received for U.S. Pat. No. 10-2018-7019412, dated Jun. 28, 2019, 6 pages with English Translation.
Korean Notification of Reason for Refusal for Korean Application No. 10-2018-7019412, dated Aug. 21, 2018, 9 pages with English Translation.
Korean Written Opinion for Korean Application No. 10-2018-7019412, dated Dec. 21, 2018, 12 pages with English Translation.
Korean Written Opinion for Korean Application No. 10-2018-7019412, dated May 29, 2019, 8 pages with English Translation.
Korean Notice of Preliminary Rejection for Korean Application No. 10-2019-7028136 dated Jan. 2, 2020, 13 pages.
Korean Grant of Patent for Korean Application No. 10-2013-7022234, dated Nov. 28, 2019, 2 pages with English Translation.

* cited by examiner

SOLAR CELL ARRAYS FOR CONCENTRATOR PHOTOVOLTAIC MODULES

CROSS-REFERENCE TO RELATED APPLICATIONS

This application is a national phase entry under 35 U.S.C. § 371 of International Patent Application PCT/EP2012/000788, filed Feb. 23, 2012, designating the United States of America and published in English as International Patent Publication WO 2012/113561 A1 on Aug. 30, 2012, which claims the benefit under Article 8 of the Patent Cooperation Treaty and under 35 U.S.C. § 119(e) to European Patent Application Serial No. 11001542.7, filed Feb. 24, 2011, the disclosure of each of which is hereby incorporated herein by this reference in its entirety.

TECHNICAL FIELD

The present invention relates to solar cell arrays comprising solar cells, contact pads and at least one (bypass) diode for concentrator photovoltaic modules.

BACKGROUND

Photovoltaic or solar cells are designed for converting the solar radiation into electrical current. In concentrator solar photovoltaic applications, the incoming sunlight is optically concentrated before it is directed to solar cells. For example, the incoming sunlight is received by a primary mirror that reflects the received radiation toward a secondary mirror that, in turn, reflects the radiation toward a solar cell, which converts the concentrated radiation to electrical current by the generation of electron-hole pairs in III-V semiconductor or single crystal silicon, for example.

The solar cell comprises a semiconductor die with metalized contact pads and, therefore, requires some manner of integrated circuit package or solar cell assembly wherein the solar cell is connected to one or more functional devices. The solar cell assembly (SCA) may particularly provide environmental protection, heat dissipation and electrical connectivity to the solar cell.

In the art, SCAs are manufactured on a continuous single substrate base or comprises multiple components that are electrically isolated from each other. A critical issue is the backside contacting of the solar cell with the substrate of the SCA. Conventionally, a continuous single substrate functioning as a cooling substrate is contacted to the backside of a solar cell by means of selective noble metal (e.g., gold) deposition that represents a tedious and time-consuming, as well as expensive, processing step.

The provision of a number of electrically isolating material elements often results in poor thermal conductivity and, thus, an inefficient overall thermal connection of the solar cell. Moreover, provision of materials of different material characteristics implies higher expenses and a plurality of connection regions and, therefore, results in a significant deterioration of the (long-life) reliability of the manufactured SCA.

In addition, in the art of concentrator photovoltaic modules, each solar cell is individually wired, for example, by means of a bypass diode for reverse overvoltage protection. Relatively large pad contact surfaces and, thus, large semiconductor components, are involved when using the diode as a wiring element. If, alternatively, a wiring pad based on printed circuit board technology is used for wiring the solar cell, there is a high risk that the circuit board will be damaged by concentrated sunlight due to the included organic compounds.

Thus, despite the recent engineering progress, there is still a need for providing an SCA that shows reliable electric contacting, efficient thermal conductivity and, moreover, taking into account production rationalization.

DISCLOSURE

The present invention addresses the above-mentioned need and, accordingly, provides a solar cell array configuration comprising:
 a plurality of solar cells provided on at least one substrate;
 a plurality of contact pads, one contact pad for each of the plurality of solar cells, provided on the at least one substrate;
 electrical wiring connecting each of the plurality of solar cells with a corresponding one of the plurality of contact pads; and
 a diode electrically connected with at least two of the plurality of solar cells, in particular, connected with a corresponding contact pad (provided for the diode) connected with the contact pad of at least two of the plurality of solar cells.

In particular, each solar cell can be provided on a respective individual substrate (one substrate for each solar cell) that may function as a heat spreader substrate. Each solar cell is neighbored by a contact pad provided on the same substrate on which the solar cell is provided. The diode may be provided on the same substrate or on a substrate different from the ones on which the solar cells and contact pads are provided. In particular, the contact pads can be entirely made of metal.

According to the invention, each solar cell is electrically connected with a contact pad and, via the contact pad, with a diode protecting the solar cell against reverse over-voltage. Alternatively, the solar cell can be contacted directly with the diode. Thus, the wiring design according to the invention offers more flexibility as compared to the art.

However, different from the art, multiple solar cells are connected to one and the same diode, for example, via the corresponding contact pad. Thus, there is no need for a large semiconductor component provided for each individual solar cell, but one diode can provide for overvoltage protection for multiple solar cells. Moreover, according to the invention, the upper surface of the diode is not to be designed in a manner to allow for the accommodation of conductors and wirings for directly contacting a solar cell and the adjacent heat spreader substance. The necessary electrical wiring of the solar cells and the heat spreader substances in parallel is provided by the contact pads that can be made with relatively low expenses as compared to the pn semiconductor diodes of the art. The geometric properties of the diode provided in the inventive solar cell array configuration are only determined by the required electrical and thermal specifications.

According to an embodiment, the contact pads do not include any insulation layer contrary to circuit boards used in the art. According to a further embodiment, the contact pads are provided on the at least one substrate by means of an electrically insulating adhesive, in particular, a transparent adhesive, for example, a transparent epoxy adhesive, that avoids absorption of the incoming concentrated solar light. Alternatively, it can be realized in a way that the adhesive is located only under the contact pad without the risk to be hit by concentrated sunlight.

Furthermore, the contact pads that have to be suitable for wiring the solar cells and the adjacent substrate, as well as the diode, may comprise a base made of aluminium, copper, bronze or brass and/or a surface for electrical connection made of gold, silver, palladium, copper, aluminium, nickel, tin or zinc.

According to an example, the diode that is connected with at least two of the contact pads may be provided in the faun of a metal-semiconductor (Schottky) diode. Since the main wiring of the solar cells is provided by the contact pads, a Schottky diode, rather than a large pn diode as in the art, can be selected. A Schottky diode with a voltage loss as small as 0.4 V, i.e., about half of the voltage loss caused by a pn diode, can be used. In comparison, a pn semiconductor bypass diode as used in the art results in a voltage drop of about 0.8 V and, thereby, a voltage loss of the entire concentrator photovoltaic module in the bypass case. Thus, voltage loss in the bypass case can be reduced as compared to the art, and the overall efficiency of the solar cell array configuration and the concentrator module comprising the solar cell array configuration can be increased. Moreover, the size of the diode die required can be reduced since the thermal power loss is lower for the Schottky diode.

As already mentioned, the at least one substrate may function as a heat spreader and, thus, may be a thermally and electrically conductive substrate for one or more solar cells. According to a particular example, the at least one substrate on which the solar cells are provided comprises or consists of aluminium or an aluminium alloy. Thus, each of the plurality of solar cells and each of the plurality of contact pads may be provided on a corresponding single heat spreader substrate, the solar cell on a heat spreader substrate is electrically connected with the contact pad provided on the same substrate, and the contact pad is electrically connected with a diode that may be provided on a different substrate.

According to an embodiment of the invention, the at least one substrate is directly provided, without an adhesion, on an electrically insulating support substrate, in particular, a glass support substrate. Individual substrates, each provided with one or more solar cells, each electrically connected with a contact pad provided on the same substrate, may be provided on the same support substrate. For example, an aluminium (heat spreader) substrate may be applied to the support substrate (e.g., made of glass) by means of a thermal spraying or plasma coating process. Thereby, the aluminium can be reliably attached to the glass surface. The spraying or coating typically results in a Gaussian distribution of the thickness of the sprayed or coated aluminium layer. In this case, each solar cell may be provided on the corresponding substrate at the region of largest thickness of the thus formed substrate (aluminium layer, for example) such that the heat generated by the solar cell can be optimally spread via the substrate.

Alternatively, the at least one substrate is a flat aluminium or aluminium alloy plate and is provided by means of an adhesive on an electrically insulating support substrate, in particular, a glass support substrate or a metal substrate comprising a dielectric layer at the upper surface, whereupon the at least one substrate, for example, the flat aluminium plate, is provided. The at least one substrate can be suitable for one or more solar cells depending on the dimensions of the substrate. If the substrate carries more than one solar cell, less electrical connections are needed.

The at least one substrate can be coated by a coating providing thermal and electrical connection with the solar cell and/or the diode. The coating is usually thinner than the substrate itself and may be made of or comprise one or more of silver, nickel, tin, copper, or other materials or alloys suitable as a surface for an electrically conductive adhesive or solder. The solar cells and/or the diode can be provided on the coating by means of an electrically conductive adhesive or solder, in particular, a silver adhesive or solder that guarantees reliable electrical connection.

Alternatively, the at least one substrate is a flat aluminium plate and is provided by means of an adhesive on an electrically insulating support substrate, in particular, a glass support substrate or a metal substrate comprising a dielectric layer at the upper surface, whereupon the at least one substrate, for example, the flat aluminium plate, is provided.

Furthermore, provided herein is a concentrator photovoltaic module comprising the solar cell array configuration according to one of the above-described examples. The concentrator solar cell module may comprise any primary concentrator optics, for example, mirrors and Fresnel lenses, as known in the art. The concentrator solar cell module may additionally comprise secondary optics, for example, dome lenses, compound parabolic concentrators, truncated pyramids or truncated cones.

Additional features and advantages of the present invention will be described with reference to the drawings. In the description, reference is made to the accompanying figures that are meant to illustrate preferred embodiments of the invention. It is understood that such embodiments do not represent the full scope of the invention.

DETAILED DESCRIPTION

Figure 1:
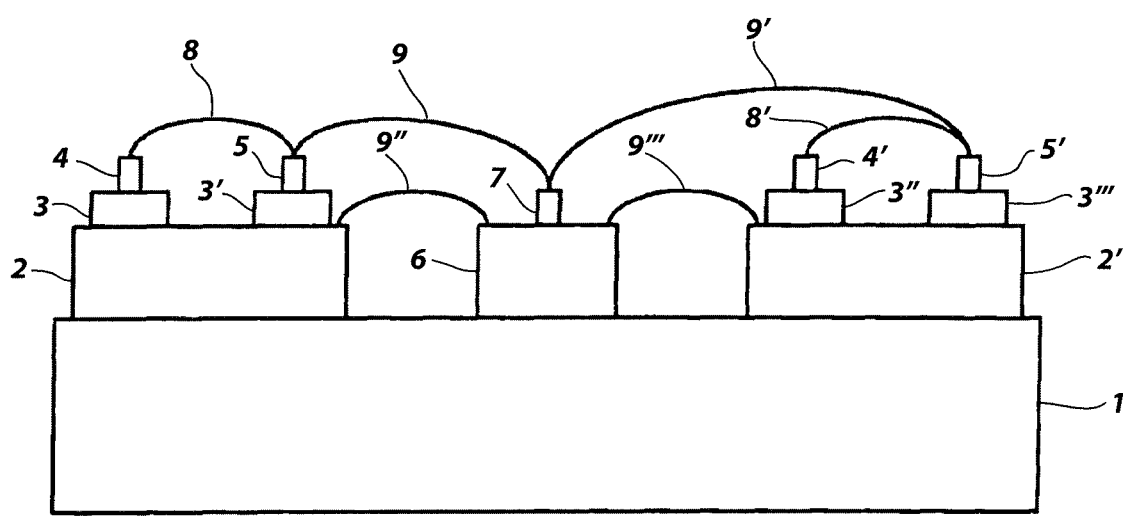
FIG. 1 illustrates an example of a solar cell array configuration comprising two solar cell arrays and a diode according to the present invention.

An exemplary embodiment of the inventive solar cell array configuration is shown in FIG. 1. The configuration includes a support substrate 1, for example, made of glass. On the support substrate 1, a first thermally and electrically conductive substrate 2 is provided, e.g., in form of a layer of aluminium sprayed on the support substrate 1. On the substrate 2, a coating 3 is formed for thermal and electrical connection with a solar cell 4 and a coating 3' is also formed for thermal and electrical connection with a contact pad 5 provided on the thermally and electrically conductive substrate 2. Similarly, on the support substrate 1, a second thermally and electrically conductive substrate 2' is provided that is coated by coatings 3" and 3'" and with a second solar cell 4' and a second contact pad 5' formed thereon.

In addition, another electrically conductive substrate 6 is formed on the support substrate 1. On the top of electrically conductive substrate 6, a diode 7 is formed that functions as a bypass diode for solar cells 4 and 4'. Electrical wiring 8, 8' is provided between the solar cells 4, 4' and the corresponding contact pads 5, 5'. Moreover, electrical wiring 9, 9' is provided between the contact pads 5, 5' and the diode 7 and electrical wiring 9", 9'" is provided between the substrates 2 and 2' and the substrate 6, respectively. The wiring can be realized in form of conventional thin- or thick-wire wiring or ribbon bond connections. Moreover, welding can be performed to achieve an appropriate wiring. Whereas the two solar cell arrays comprising a substrate 2, 2', a solar cell 4, 4' and a contact pad 5, 5' are electrically connected with the diode 7, in fact, a larger number of solar cell arrays can be protected by a single diode. The diode is preferably of the Schottky type. Each of the solar cells 4, 4' may be a multi-junction solar cell that comprises, for example, three cells showing optimal absorption in different wavelength ranges. A triple cell structure may comprise a GaInP top cell layer with a gap value of 1.8 eV, a GaAs intermediate cell layer with a gap value of 1.4 eV and a Ge bottom cell layer with a gap value of 0.7 eV, for instance.

In the shown example, one single small-scale Schottky diode can provide overvoltage protection for multiple solar cells. In particular, with respect to solar cell arrays of the art, the overall number of Galvanic elements and the number of different processed materials that result in the formation of Galvanic elements, can effectively be reduced according to the present invention.

Figure 2:
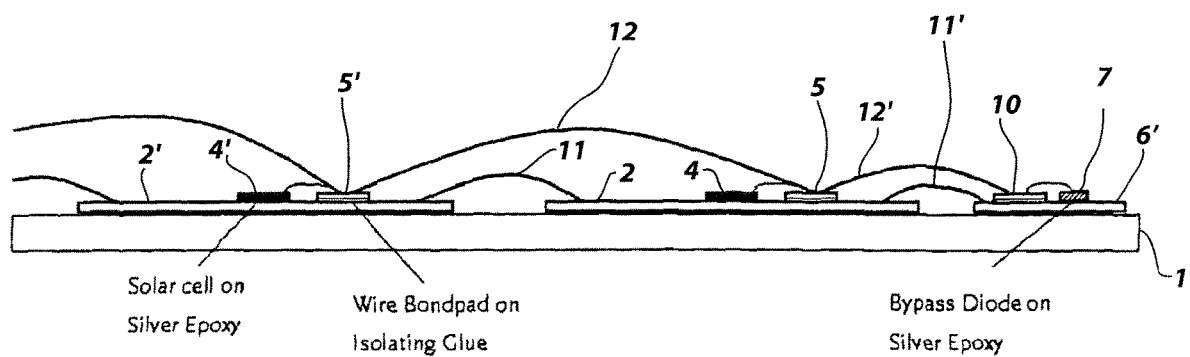
FIG. 2 illustrates an example of a solar cell array configuration comprising two solar cell arrays and a diode similar to the one shown in FIG. 1 but with a different wiring.

A comparable embodiment to the one shown in FIG. 1 but with a different wiring is illustrated in FIG. 2. The same elements already shown in FIG. 1 are indicated with the same reference numbers. The diode 7 is attached, for example, by silver epoxy, to the electrically conductive substrate 6'. Further, on the same substrate 6', contact pad 10 is provided. Solar cells 4 and 4" are provided on substrates 2 and 2', respectively. By wirings 11 and 11', substrates 2 and 2' and substrates 2 and 6' are, respectively, electrically connected with each other. Moreover, electrical connection between contact pads 5 and 5' by wiring 12 and electrical connection between pads 5 and 10 by wiring 12' is established. Thus, whereas in the example shown in FIG. 1, bonding directly to the bypass diode is realized, and in the example shown in FIG. 2, bonding to a contact pad adjacent to the bypass diode is realized.

Figure 3:
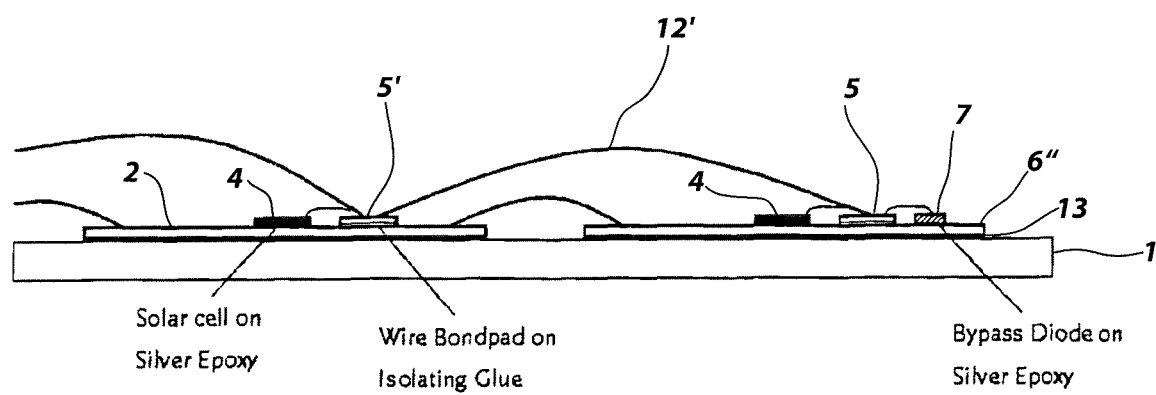
FIG. 3 illustrates another example of a solar cell array configuration comprising two solar cells and a diode, wherein one of the solar cells and the diode are provided on the same substrate.

FIG. 3 illustrates a further embodiment, wherein one of the solar cells and the diode are provided on the same the substrate. As can be seen from FIG. 3, the diode 7 and solar cell 4 are provided on the substrate 13 and electrically connected with each other via contact pad 5. Moreover, electrical connection to the solar cell 4 provided on substrate 2 is established by wiring 12' connecting pads 5 and 5' (solar cell 4 is connected to contact pad 5' by another wiring). The diode is serving as bypass diode for other solar cells as well when using an appropriate wiring.

All previously discussed embodiments are not intended as limitations but serve as examples illustrating features and advantages of the invention. It is to be understood that some or all of the above-described features can also be combined in different ways.

The invention claimed is:

1. A solar cell array, comprising: a plurality of solar cells on a plurality of electrically conductive substrates, each solar cell of the plurality of solar cells on a different electrically conductive substrate;
    a plurality of contact pads, one contact pad for each of the plurality of solar cells, each contact pad of the plurality of contact pads located on a respective one of the plurality of electrically conductive substrates;
    a first electrical wiring directly connecting each of the plurality of solar cells to a corresponding one of the plurality of contact pads;
    a single bypass diode on another electrically conductive substrate and physically isolated from the plurality of contact pads and from the plurality of solar cells; and
    a second electrical wiring directly connecting the single bypass diode to at least two contact pads of the plurality of contact pads, the at least two contact pads directly connected respectively to at least two of the plurality of solar cells by the first electrical wiring, such that the single bypass diode is connected to the at least two of the plurality of solar cells via the at least two contact pads and provides overvoltage protection for the at least two of the plurality of solar cells and the single bypass diode is the only bypass diode to which the at least two of the plurality of solar cells are connected, the another electrically conductive substrate comprising a different substrate than the plurality of electrically conductive substrates;
    wherein the plurality of electrically conductive substrates and the another electrically conductive substrate are coated by a coating providing thermal and electrical connection with at least one of the plurality of solar cells and the single bypass diode; and wherein the at least one of the plurality of solar cells and the single bypass diode are provided on the coating, such that the coating is located directly under and in physical contact with the at least one of the plurality of solar cells and the single bypass diode.

2. The solar cell array of claim 1, wherein the contact pads of the plurality of contact pads are attached to the plurality of electrically conductive substrates by means of an electrically insulating transparent adhesive.

3. The solar cell array of claim 1, wherein the contact pads of the plurality of contact pads do not include insulation layers.

4. The solar cell array of claim 1, wherein the contact pads of the plurality of contact pads comprise a base comprising at least one of aluminum, copper, bronze and brass, and a surface for electrical connection comprising at least one of gold, silver, palladium, copper, aluminum, nickel, tin and zinc.

5. The solar cell array of claim 1, wherein the single bypass diode is a Schottky diode.

6. The solar cell array of claim 1, wherein the plurality of electrically conductive substrates are thermally and electrically conductive substrates.

7. The solar cell array of claim 6, wherein the plurality of electrically conductive substrates comprise aluminum or an aluminum alloy.

8. The solar cell array of claim 1, wherein the plurality of electrically conductive substrates are disposed directly on an electrically insulating support substrate.

9. The solar cell array of claim 1, wherein the plurality of electrically conductive substrates are flat aluminum or aluminum alloy plates and are attached by an adhesive on an electrically insulating support substrate.

10. The solar cell array of claim 1, wherein each solar cell of the plurality of solar cells is a multi junction solar cell comprising three cells showing optimal absorption in different wavelength ranges.

11. The solar cell array of claim 8, wherein each solar cell of the plurality of solar cells is disposed respectively on one electrically conductive substrate of the plurality of electrically conductive substrates, each electrically conductive substrate of the plurality of electrically conductive substrates having a Gaussian-like thickness distribution, each solar cell of the plurality of solar cells being located on a corresponding one electrically conductive substrate of the plurality of electrically conductive substrates at a region of highest thickness of the corresponding one electrically conductive substrate of the plurality of electrically conductive substrates.

12. The solar cell array of claim 1, wherein the coating provided on the plurality of electrically conductive substrates comprises one or more of silver, nickel, tin, and copper.

13. The solar cell array of claim 12, wherein the plurality of solar cells and the single bypass diode are provided on the coating by an electrically conductive adhesive or solder.

14. A concentrator photovoltaic module comprising: a solar cell array including:
  a plurality of solar cells on a plurality of electrically conductive substrates, each solar cell of the plurality of solar cells on a different electrically conductive substrate;
  a plurality of contact pads, one contact pad for each of the plurality of solar cells, located on a respective one of the plurality of electrically conductive substrates;
  a first electrical wiring directly connecting each of the plurality of solar cells to a corresponding one of the plurality of contact pads; and a single bypass diode on another electrically conductive substrate and physically isolated from the plurality of contact pads and from the plurality of solar cells; and
  a second electrical wiring directly connecting the single bypass diode to at least two contact pads of the plurality of contact pads, the at least two contact pads directly connected respectively to at least two of the plurality of solar cells by the first electrical wiring, such that the single bypass diode is connected to the at least two of the plurality of solar cells via the at least two contact pads and provides overvoltage protection for the at least two of the plurality of solar cells and the single bypass diode is the only bypass diode to which the at least two of the plurality of solar cells are connected, the another electrically conductive substrate comprising a different substrate than the plurality of electrically conductive substrates; and
  wherein the plurality of electrically conductive substrates and the another electrically conductive substrate are coated by a coating providing thermal and electrical connection with at least one of the plurality of solar cells and the single bypass diode; wherein the at least one of the plurality of solar cells and the single bypass diode are provided on the coating, such that the coating k located directly under and in physical contact with the at least one of the plurality of solar cells and the single bypass diode: and optical devices located and configured to concentrate solar radiation and direct the concentrated solar radiation onto the plurality of solar cells of the solar cell array.

15. The concentrator photovoltaic module of claim 14, wherein the contact pads of the plurality of contact pads are attached to the plurality of electrically conductive substrates by an electrically insulating transparent adhesive.

16. The concentrator photovoltaic module of claim 15, wherein the contact pads of the plurality of contact pads do not include insulation layers.

17. The concentrator photovoltaic module of claim 14, wherein the single bypass diode is a Schottky diode.

18. The concentrator photovoltaic module of claim 14, wherein each solar cell of the plurality of solar cells is a multi junction solar cell comprising three cells showing optimal absorption in different wavelength ranges.

* * * * *

UNITED STATES PATENT AND TRADEMARK OFFICE
CERTIFICATE OF CORRECTION

PATENT NO.         : 10,804,420 B2
APPLICATION NO.    : 14/000260
DATED              : October 13, 2020
INVENTOR(S)        : Eckart Gerster and Martin Ziegler Page 1 of 1

It is certified that error appears in the above-identified patent and that said Letters Patent is hereby corrected as shown below:

In the Specification
Column 3,   Line 8,    change "in the faun" to --in the form--

In the Claims
Claim 10,   Column 6,   Line 57,   change "a multi junction" to --a multi-junction--
Claim 14,   Column 8,   Line 14,   change "k located directly" to --is located directly--
Claim 14,   Column 8,   Line 16,   change "diode: and optical devices" to
                                    --diode; and
                                    optical devices--
Claim 18,   Column 8,   Line 31,   change "multi junction solar" to --multi-junction solar--

Signed and Sealed this
Twenty-fourth Day of November, 2020

Andrei Iancu
*Director of the United States Patent and Trademark Office*